United States Patent
John et al.

(10) Patent No.: US 7,272,523 B1
(45) Date of Patent: Sep. 18, 2007

(54) TRIMMING FOR ACCURATE REFERENCE VOLTAGE

(75) Inventors: Soji K. John, Coppell, TX (US);
Baoson Nguyen, Garland, TX (US);
Terry L. Mayhugh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 11/364,741

(22) Filed: Feb. 28, 2006

(51) Int. Cl.
*G06F 19/00* (2006.01)

(52) U.S. Cl. .................... 702/85; 700/28; 700/54; 702/57; 702/64; 702/107; 713/300; 713/340

(58) Field of Classification Search ............. 700/28, 700/54; 702/57, 64, 85, 107, 127, 189; 713/300, 713/340
See application file for complete search history.

(56) References Cited

U.S. PATENT DOCUMENTS

| | | | | |
|---|---|---|---|---|
| 3,543,093 A | * | 11/1970 | Linfield | 361/88 |
| 3,978,418 A | * | 8/1976 | Louw | 330/256 |
| 4,366,444 A | * | 12/1982 | Schade, Jr. | 330/256 |
| 5,021,679 A | * | 6/1991 | Fairbanks et al. | 307/66 |
| 5,053,640 A | * | 10/1991 | Yum | 327/539 |
| 5,325,045 A | | 6/1994 | Sundby | |
| 5,361,001 A | * | 11/1994 | Stolfa | 327/530 |
| 5,552,694 A | * | 9/1996 | Appeltans | 323/222 |
| 5,838,076 A | * | 11/1998 | Zarrabian et al. | 307/115 |
| 6,075,354 A | * | 6/2000 | Smith et al. | 323/313 |
| 6,147,908 A | * | 11/2000 | Abugharbieh et al. | 365/185.2 |
| 6,472,897 B1 | * | 10/2002 | Shyr et al. | 324/765 |
| 6,501,256 B1 | * | 12/2002 | Jaussi et al. | 323/315 |
| 6,590,372 B1 | | 7/2003 | Wiles, Jr. | |
| 6,591,210 B1 | | 7/2003 | Lorenz | |
| 6,608,472 B1 | * | 8/2003 | Kutz et al. | 323/313 |
| 6,720,800 B2 | * | 4/2004 | Shyr et al. | 327/103 |
| 7,081,842 B2 | * | 7/2006 | Cranford et al. | 341/121 |
| 2003/0006747 A1 | * | 1/2003 | Jaussi et al. | 323/315 |
| 2003/0085741 A1 | * | 5/2003 | Shyr et al. | 327/100 |
| 2004/0216019 A1 | * | 10/2004 | Shyr et al. | 714/724 |
| 2006/0043957 A1 | * | 3/2006 | Carvalho | 323/313 |

FOREIGN PATENT DOCUMENTS

JP  61-97056 A  *  5/1986

OTHER PUBLICATIONS

John Constantopoulos and Walter Nadler, "Power Chips Benefit From Final-Test Trim", Power Electronics Technology, www.powerelectronics.com, Mar. 2005, pp. 52-55.

* cited by examiner

*Primary Examiner*—Edward R Cosimano
(74) *Attorney, Agent, or Firm*—Ronald O. Neerings; Wade James Brady, III; Frederick J. Telecky, Jr.

(57) ABSTRACT

A method for trimming reference voltage circuitry includes defining a desired target reference voltage for a set of at least one die. At least two reference voltages are measured for at least two different trim settings associated with a given die of the at least one die. A modified target reference voltage is determined for the given die based on the at least two measured reference voltages. A trim setting associated with the reference voltage circuitry of the given die is set according to the modified target reference voltage so as to compensate for an offset voltage and substantially achieve the desired target reference voltage.

17 Claims, 3 Drawing Sheets

TRIMMING FOR ACCURATE REFERENCE VOLTAGE

TECHNICAL FIELD

This invention relates to integrated circuits, and more specifically to a trimming methodology that can be employed to achieve an accurate bandgap voltage.

BACKGROUND

With the continuing trend of increased device densities in integrated circuits (ICs), such as deep submicron technologies, manufacturers are required to achieve equal or better performance. One baseline parameter that is utilized in most integrated circuits is a reference voltage. In circuits having higher performance requirements, a temperature stable reference voltage is required. One type of reference voltage circuit is known as a bandgap reference circuit. The main principal of generating a bandgap reference voltage is to balance a negative temperature coefficient of a pn junction with a positive temperature coefficient of thermal voltage ($V_t$=kT/q), where k is Bolzman's constant, T is absolute temperature (Kelvin) and q is charge.

A typical bandgap circuit relies on two groups of transistors running at different emitter current densities. A rich transistor, for instance, will typically operate at a current density that is much (e.g., about ten times) greater than the current density of a leaner transistor. The difference in current densities will further cause a difference between the base-emitter voltages of the two transistor groups, referred to as a delta base-emitter voltages ($\Delta V_{be}$). The $\Delta V_{be}$ is usually amplified by a factor (e.g., about 10) and added to a $V_{be}$ voltage of a transistor. The sum of these two voltages adds up to about 1.2 volts, which is approximately the bandgap of silicon.

In many integrated circuits where high performance is required, the bandgap reference can be trimmed to a desired target voltage. For instance, the bandgap reference voltage may be required to provide a voltage within a predefined range of a desired voltage, which can be specified in terms of a percentage of variation of the bandgap reference. The specified voltage can vary according to the application of the IC. Where a precision bandgap reference is not required for a particular IC, the bandgap voltage can remain untrimmed.

Since bandgap reference voltages may play a pivotal role in establishing the accuracy and performance of many integrated circuits and the systems in which they are implemented, various trimming techniques and algorithms have been developed to compensate for process variations, temperature, and complex second-order and third-order effects. The trimming process typically is performed during late stages of IC fabrication and includes a scan of the trim codes to meet a desired target bandgap reference voltage. As a common example, the trimming can be performed on individual die on the wafer.

As device dimensions shrink into smaller submicron sizes, improved trimming procedures are needed to help ensure adequate performance of ICs for their intended applications.

SUMMARY

The present invention relates generally to a trimming approach that can be employed to achieve an accurate reference voltage for an integrated circuit chip. The trim methodology can be applied during production, such as on a die-by-die basis, or post-production, such as on a chip-by-chip basis. The trimming methodology operates to compensate for voltage offset that is usually introduced by transistor mismatches in one or more circuits in reference voltage circuitry. The trimming method also can compensate for process variations that are inherent in the manufacturing process One aspect of the present invention provides a method for trimming reference voltage circuitry. The method includes defining a desired target bandgap reference voltage for a set of at least one die. At least two bandgap reference voltages are measured for at least two different bandgap trim settings associated with a given die of the at least one die. A modified target reference voltage is determined for the given die based on the at least two measured bandgap voltages. A trim setting associated with the bandgap reference voltage circuitry of the given die is set according to the modified target bandgap reference voltage so as to compensate for an offset voltage and substantially achieve the desired target bandgap reference voltage. Another aspect of the present invention provides a system for trimming bandgap circuitry to provide a desired bandgap reference voltage for a given die. The system includes means for measuring at least two bandgap voltages for at least two different trim settings of the given die. The system also includes means for determining a modified target bandgap reference voltage for the given die based on the at least two measured bandgap reference voltages. The system also includes means for programming at least one trim setting of the bandgap voltage reference circuitry associated with the given die according to the modified target bandgap reference voltage.

The foregoing examples as well as others contained herein can be utilized to reduce the effect of mismatch induced offset so as to achieve highly accurate bandgap voltage.

DETAILED DESCRIPTION

The present invention relates generally to a system and method for trimming bandgap reference voltage circuitry to allow a more accurate bandgap reference voltage relative to conventional approaches. The approach described herein reduces the effect of mismatch, such as is induced by offset in the bandgap circuitry, including offset in the bandgap core as well as an associated output circuitry. As part of the trimming methodology, bandgap reference voltages are measured for at least two different trim codes to determine an amount of offset associated with the bandgap circuitry in a given die. A modified target trim voltage can be determined for the die based on the offset. Scanning of trim codes can be performed to set the bandgap reference voltage for the die to the modified target trim voltage. A second scan of the output trim can then be used to compensate for the modification in target trim to yield the desired reference voltage. The process can be performed for each die on a wafer to establish high accuracy bandgap voltage references. For example, the methodology can be employed to provide highly accurate reference voltages (e.g., better than 1.5%) in digital deep-sub-micron and other technologies.

Figure 1:
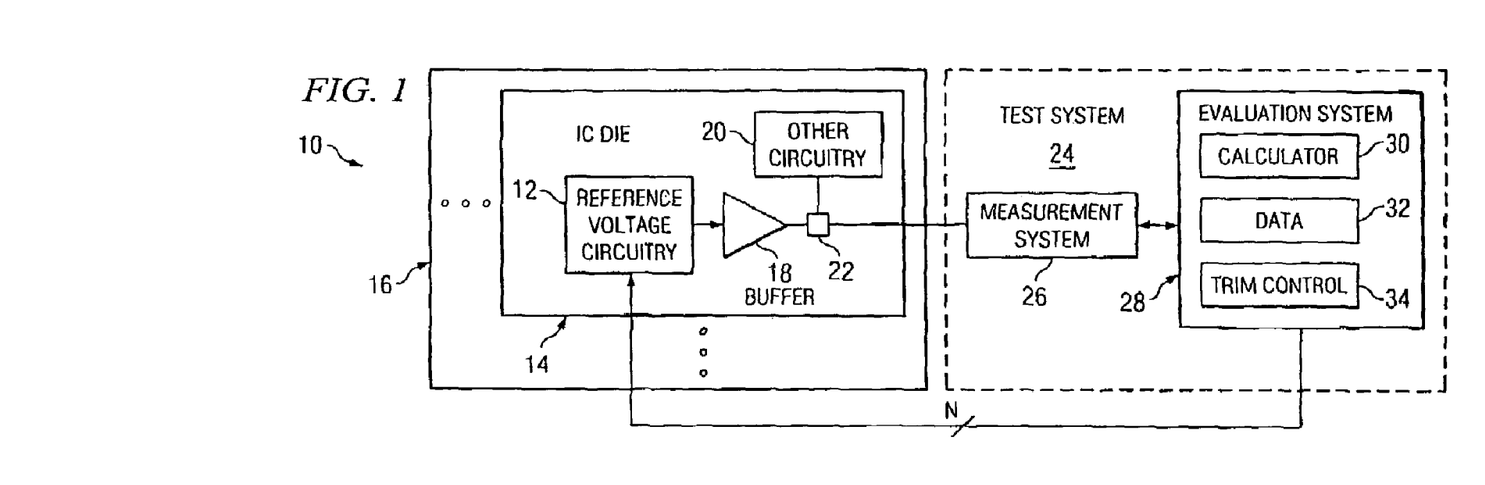
FIG. 1 depicts a system for trimming bandgap voltage reference circuitry according to an aspect of the present invention.

FIG. 1 depicts an example of a system 10 that can be utilized for trimming bandgap reference voltage circuitry 12 of an IC die 14 according to an aspect of the present invention. For purpose of simplicity of explanation and not by way of limitation, a single IC die 14 on a wafer 16 is depicted in the example of FIG. 1. Those skilled in the art will understand and appreciate that the wafer 16 typically will include a plurality (e.g., hundreds or thousands) of IC die formed as part of an IC fabrication process.

As is known in the art, the bandgap voltage reference circuitry 12 provides a reference voltage for use by the IC chip that is to be formed from the IC die 14. Because different associated circuitry may require reference voltages different from the core bandgap reference voltage, the reference voltage circuitry 12 includes programmable or configurable networks that can be trimmed to set the reference voltage for the chip that comprises the IC die. For instance, ratios of resistor networks can be set to adjust the reference voltage above or below a core bandgap voltage provided by the bandgap reference voltage circuitry 12. The reference voltage circuitry 12 provides the trimmed reference voltage to a buffer 18, such as a unity gain amplifier. The buffer 18 provides a buffered reference voltage for use by other circuitry 20 on the IC die 14. The buffer 18, for example, may provide the buffered reference voltage to a pad (or bus) 22 that distributes the bandgap reference to the rest of the chip. The buffer 18 thus provides desired isolation between the reference voltage circuitry 12 and the other circuitry 20 that is coupled to the pad (or bus) 22 for utilizing the reference voltage. It is to be understood that some circuitry on the IC die (not shown) may not require a bandgap voltage reference, but instead may utilize other internal or external power supplies.

The system 10 can also include a test system 24 that is programmed and/or configured to test and program (e.g. trim) the IC die 14 on the wafer 16. Those skilled in the art will understand and appreciate various type of test systems that can be utilized to perform the testing and programming of the reference voltage circuitry 12, which may include commercially available components, proprietary components or a combination of commercially available and proprietary components. As used herein, the term "component" is intended to encompass hardware, software, or a combination of hardware and software. As an example, the test system 24 can be a stand alone test system, such as automated test equipment (ATE). Alternatively, the test system 24 can include a plurality of different components that cooperate to perform measurements and testing of the parameters of the IC die 14 for programming the bandgap voltage reference circuitry 12 on the IC die 14 according to an aspect of the present invention.

The test system 24 can also include wafer handling subsystem (e.g., part of the ATE or a separate system) that positions the wafer 16 and one or more probes of the test system for accessing appropriate pads on the IC die 14 (e.g., including the output pad 22). The test system 24 thus can position the wafer 16 to enable desired contact between one or more probe tips and the pads 22 on the IC die 14. The test system 24 can provide appropriate signals and power to the IC die 14 under test (which may include one or more IC die at a time). For example, the test system 24 can provide one or more test signals to test and measure circuit parameters of the IC die 14. The test system 24 can also provide control signals that may operate to set one or more circuit parameters, including trimming circuitry as part of a reference voltage trimming operation. The trimming operation, for example, may include setting a ratio of appropriate resistors in the bandgap reference voltage circuitry 12 to trim the bandgap reference voltage to a specified voltage. As but one example, the test system may program memory (e.g., EEPROM, FLASH or other non-volatile memory) with appropriate control data that establishes the desired parameters (e.g., by setting trim codes) of the reference voltage circuitry 12 for providing a desired reference voltage. As mentioned above, the desired reference voltage can vary according to the other circuitry 20 in the IC die 14 and voltage requirements of the IC chip being fabricated.

In the example of FIG. 1, the test system 24 includes a measurement system 26. The measurement system can include one or more probes that contact one or more pads, including the pad 22 for measuring the buffered reference voltage of the IC die 14. As discussed herein, the reference voltage provided by the buffer and the pad 22 will include mismatch induced offset associated with the bandgap reference voltage circuitry 12. The offset can include a core offset as well as an output offset, such as may be due (at least in part) due to process variations associated with the fabrication process. For instance, as the gate lengths of transistor devices decrease, as occurs in deep submicron technologies, the mismatch between transistors increases. The core offset can statistically vary for each die across a substrate (e.g., a wafer). The transistor mismatch further causes offsets in associated circuits in the IC. Therefore, the test system 24 is programmed and/or configured to determine the mismatch induced offsets in the reference voltage circuitry and perform trimming that compensates for such offset to provide more accurate bandgap reference voltage. The measurement system 26 provides the measurement of the buffered reference voltage to an associated evaluation system 28 to increase the accuracy of trimming, as described herein.

The evaluation system 28 can be implemented in a variety of ways, such as including hardware, software or a combination of hardware and software configured to perform the functions described herein. For instance, the evaluation system can be implemented as a personal computer or workstation or other types of test equipment having computer-executable instructions for performing the evaluation and control functions described herein based on the measurement data from the measurement system 26. In the example of FIG. 1, the evaluation system 28 includes a calculator 30 that is programmed to calculate a compensated target bandgap reference voltage based on the measurements made by the measurement system 26.

By way of example, the measurement system 26 can measure the buffered bandgap reference voltage for a plurality (e.g., two or more) of bandgap trim code settings. For instance, the measurement system can obtain measurements of the bandgap reference voltage at the pad 22 for a lowest trim code setting and for a highest trim code setting. By obtaining measurements for different trim code settings, a suitable level of variation between bandgap reference voltages is provided from which the calculator 30 can compute an appropriate offset value. The calculator 30 can compute a core offset value that is stored in memory, indicated as data 32. The data 32 can also include the measured buffered reference voltage values, the corresponding trim code settings associated with such data, as well as other circuit parameters. The calculator 30 can also compute a new, modified target bandgap reference voltage as a function of the computed core offset. After the calculator 30 determines the modified target bandgap reference voltage, the new target can be utilized to trim the reference voltage circuitry 12.

As part of the trimming process, the evaluation system 28 employs the measurements provided by the measurement system 26 to determine if the target voltage is met. In the example of FIG. 1, the evaluation system 28 also includes trim control 34 that is operative to control and scan the trim code settings of the bandgap voltage reference circuitry 12 according to the computed modified target bandgap reference voltage. For example, the trim control 34 can start a scan at an initial trim code setting and sequentially increment the trim codes until the measurement system measures a buffered bandgap value that is substantially equal to the computed modified target bandgap reference voltage. The measurement system 26 provides an indication of the measured voltage at the pad 22 for each of the respective trim codes, as set by the trim control 34. The trim code that causes the reference voltage at the pad 22 to best match the target trim code can be utilized as the trim code for establishing the bandgap reference voltage of the IC die 14.

The trim control can implement a trim process that includes two phases: a first phase, as described above, for trimming core bandgap portion (not shown) of the bandgap circuitry, and a second phase for trimming an output stage (not shown in FIG. 1) of the bandgap circuitry. For example, the calculator 30 can also be programmed to determine another target bandgap voltage corresponding to a compensated voltage for trimming back to the original target bandgap voltage for the IC die 14. The trim control 34 thus can perform a scan of the output trim codes of the bandgap reference voltage circuitry 12 to set the output trim code so that the reference voltage at the pad 22 is substantially equal to the compensated target reference voltage, thereby further compensating for the offset in the reference voltage circuitry 12.

Figure 2:
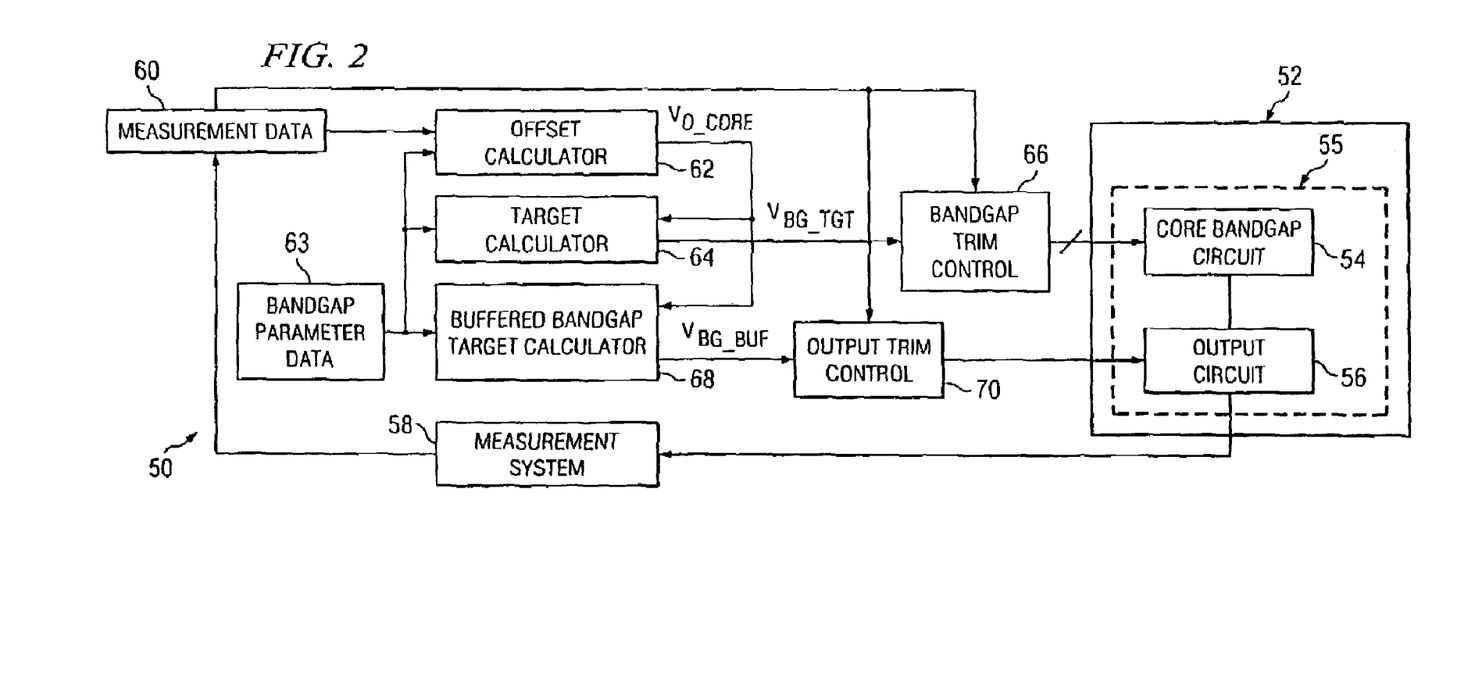
FIG. 2 depicts a system for trimming bandgap voltage reference circuitry according to another aspect of the present invention.

FIG. 2 depicts another example of a test system 50 that can be implemented according to an aspect of the present invention. The test system 50 can be implemented in a computer having computer executable instructions to perform the various functions described herein. Additionally or alternatively, the system 50 can be implemented as one or more units of test equipment configured to perform the functions for trimming the voltage reference to a desired target voltage, which compensates for transistor offset in the core bandgap circuit 54. For example, the test system 50 can be implemented as part of a wafer sort process, such as may be implemented at the end of wafer fabrication for testing, for setting the voltage reference of each die on an associated wafer. Those skilled in the art will understand and appreciate that alternatively, the test system 50 can be performed on a fabricated and packaged integrated circuit chip.

The test system 50 can be coupled to an IC die 52, such as via one or more probes that are coupled to electrically conductive pads on the IC die (e.g., the IC die being part of a wafer including a plurality of die). The IC die 52 includes a core bandgap circuit 54 and an associated output circuit 56, which collectively form bandgap circuitry 55 for the IC die.

The core bandgap circuit 54 is configured to provide a predetermined core bandgap voltage (e.g., $V_{BG\_CORE}$=m*$(\Delta V_{be})+V_{be}$=about 1.2 volts, where m is a constant corresponding to a ratio of resistors in the bandgap circuit). The core bandgap voltage reference circuit 54 can be trimmed (e.g., by setting a ratio of resistors in the bandgap circuit) to adjust the core bandgap reference voltage. The bandgap circuit 54 provides the core bandgap reference voltage to the output circuit 56, which is configured to adjust the core bandgap reference voltage (e.g., up or down) to achieve a target bandgap reference voltage, which can be specified for the IC that is formed from the die 52.

The test system 50 thus is programmed and/or configured to implement trimming by providing corresponding trim codes to the bandgap voltage reference circuitry 55 so as to compensate for mismatch induced offset in the bandgap circuitry 55. The trim codes provided to the voltage reference circuit 54 are referred to herein as core trim codes and the trim codes to the output circuit 56 are referred to as output trim codes. Collectively, the core trim codes and output trim codes can be referred to as the bandgap trim codes. Each of the trim codes can correspond to a digital value (e.g., one or more bits) that is employed to set a ratio of resistors for adjusting the bandgap reference voltage that is provided by the voltage reference circuitry 55. The trim codes can be stored in memory (e.g., EEPROM, FLASH, registers, etc.) which can be employed to control switching in and out resistors in an associated resistor network to establish a corresponding resistor ratio for each of the circuits 54 and 56.

The test system 50 also includes a measurement system 58 that is coupled to the IC die 52 for measuring the bandgap voltage reference voltage of the IC die 52. As described herein, the bandgap reference voltage measured by the measurement system 52 can vary based upon trim code settings for the bandgap circuit 54 and the output circuit 56. The measurement system 58 provides an indication of the measured bandgap reference voltage and stores it as measurement data, indicated at 60. The measurement data 60 can include data corresponding to the respective bandgap voltage reference measurements in conjunction with the trim codes associated with each respective measurement. For example, the measurement data 60 can be stored in memory of a computer or workstation that is used to implement at least a portion of the test system 50.

The test system 50 includes an offset calculator 62 that is programmed to ascertain an offset voltage for the core of the bandgap circuit 54. As mentioned above, the offset results substantially from transistor mismatches in the bandgap circuitry 55. The offset calculator 62 can compute offset voltage $V_{O\_CORE}$ as a function of the measured bandgap reference voltage, such as for two (or more) different trim code settings. As an example, the trim code can correspond to a lowest core trim code and highest core trim code for the bandgap voltage reference to provide sufficient variation between the bandgap voltages measured by the measurement system 58. By way of further example, the offset voltage $V_{O\_CORE}$ can be computed as follows:

$$V_{O\_CORE} = \frac{V_{BG1} - V_{BG0}}{R_{OUT\_NOM} \times (R_{CORE1} - R_{CORE0})} - \Delta V_{BE} \qquad \text{Eq. 1}$$

where:

$R_{CORE1}$=resistor ratio for a first core trim setting (e.g., core trim code set to all 0's);

$R_{CORE0}$=resistor ratio for a second core trim setting (e.g., core trim code set to all 1's);

$V_{BG1}$=measured buffered bandgap voltage at trim code $R_{CORE1}$;

$V_{BG0}$=measured buffered bandgap voltage at trim code $R_{CORE0}$; and $R_{OUT\_NOM}$=nominal output trim ratio for output circuit 56.

By including the core offset and associated offset of the buffer in the bandgap circuitry 55, the measured bandgap voltages $V_{BG1}$ and $V_{BG0}$ for $R_{CORE1}$ and $R_{CORE0}$, respectively, can be expressed as follows:

$$V_{BG0}=R_{OUT\_NOM}\times(V_{BE}+R_{CORE0}\times(\Delta V_{BE}+V_{O\_CORE}))+V_{O\_BUF} \quad \text{Eq. 2}$$

$$V_{BG1}=R_{OUT\_NOM}\times(V_{BE}+R_{CORE1}\times(\Delta V_{BE}+V_{O\_CORE}))+V_{O\_BUF} \quad \text{Eq. 3}$$

where:

$V_{BE}$=base-emitter voltage for a given temperature (e.g., room temperature, about 25 Deg. C.);

$\Delta V_{BE}$=a known constant for the given temperature; and $V_{O\_BUF}$=offset due to the output buffer of the bandgap circuitry 55.

Thus, it will be evident that, by subtracting the measurements of Eq. 2 from Eq. 3, the core offset voltage $V_{O\_CORE}$ can be derived as set forth in Eq. 1. It should be noted that the offset due to the buffer in the bandgap circuitry 55 cancels out. Known parameters, including $\Delta V_{BE}$ and $R_{OUT\_NOM}$, can be stored in memory as bandgap parameter data 63. Other parameters associated with the bandgap circuitry can also be stored in the bandgap parameter data 63.

The test system 50 also includes a bandgap target calculator 64 that computes a target bandgap reference voltage that compensates for the mismatch induced offset, such as computed by the offset calculator 62. That is, the bandgap target calculator 64 can compute a modified target bandgap voltage for the IC die 52 as a function of the computed core offset voltage $V_{O\_CORE}$. For example, the voltage target calculator 64 can compute a modified or adjusted bandgap target reference $V_{BG\_TGT}$ as follows:

$$V_{BG\_TGT} = V_{BG\_ORIGINAL} - \frac{R_{CORE\_MID} \times V_{O\_CORE}}{R_{OUT\_NOM}} \quad \text{Eq. 4}$$

where:

$V_{BG\_ORIGINAL}$=original bandgap reference voltage for the IC die not taking into account statistical mismatches; and $R_{CORE\_MID}$=resistor ratio for setting for core bandgap trim code (e.g., a core trim code that is between codes for $R_{CORE1}$ and $R_{CORE0}$)

It will be further appreciated that the approach described above results in a bandgap target trim voltage $V_{BG\_TGT}$ at room temperature that compensates for the particular offset for the given die 52. The offset for each die can be computed individually for each die based upon the respective measurements of the bandgap voltage references for the two or more trim codes (see, e.g., Eqs. 2 and 3) for that die. Thus, the adjusted bandgap target trim voltage $V_{BG\_TGT}$ may be different for each die on a wafer, thereby allowing optimum temperature performance. The test system 50 also includes a bandgap trim control 66 that is programmed and/or configured to set core trim codes for the core bandgap circuit 54. During the trimming process implemented by the test system 50, for example, the bandgap trim control 66 can scan the corresponding trim codes until the measurement system 58 measures a bandgap reference voltage from the die 52 that best approximates the bandgap target trim voltage $V_{BG\_TGT}$ computed by the bandgap target calculator 64. The bandgap trim control 66 can set the trim code for the bandgap circuit 54 when the measured bandgap reference voltage substantially equals adjusted bandgap target trim voltage $V_{BG\_TGT}$, such as according to Eq. 4.

As mentioned above, the test system 50 can also be utilized to set the trim code for the output circuit 56 to trim back to get the desired ideal target voltage at the output of the output circuitry. The test system 50 thus includes a buffered bandgap target calculator 68 that computes a buffered target reference voltage $V_{BG\_BUF}$. The buffered bandgap target calculator 68 can compute the buffered bandgap target reference voltage to achieve the desired target reference voltage as a function of the bandgap target trim voltage $V_{BG\_TGT}$ and a resistor ratio $R_{OUT\_NEW}$ in the output circuit 56. For example, the buffered bandgap target calculator 68 can determine the buffered bandgap target reference voltage $V_{BG\_BUF}$ as follows:

$$V_{BG\_BUF} = R_{OUT\_NEW} \times \left(V_{BG\_ORIGINAL} - \frac{R_{CORE\_MID} \times V_{O\_CORE}}{R_{OUT\_NOM}}\right) \quad \text{Eq. 5}$$

where:

$V_{BG\_BUF}$=buffered bandgap target reference voltage; and $R_{OUT\_NEW}$=new resistor ratio of output circuit 56 to achieve desired target reference voltage.

A comparison between Eqs. 4 and 5 demonstrates that the second term of Eq. 5 (in parentheses) is equal to the adjusted bandgap target trim voltage $V_{BG\_TGT}$ from Eq. 4.

The buffered bandgap target calculator 68 provides an indication of the buffered target reference voltage to an output trim control 70. The output trim control 70 is coupled to set the output trim code for the output circuit 56. For example, the output trim control 70 can perform a scan of trim codes (e.g., by setting $R_{OUT\_NEW}$ to different values) until the bandgap reference voltage measured by the measurement system 58 approximates the desired buffered bandgap target reference voltage $V_{BG\_BUF}$ computed by the calculator 68. This corresponds to trimming back to the desired reference voltage (specified for use by associated circuitry on the IC die) after the modified target voltage has been set in the core bandgap circuit 54. Thus, when the measured voltage substantially equals the computed target voltage, the output trim control 70 can set the corresponding output trim code in the output circuit such that the voltage reference is set to mitigate the effects of mismatch induced offset for the IC die 52.

The test system 50 can implement similar functions for each of the die on a respective wafer. As mentioned above, it will be appreciated that the target bandgap reference voltage $V_{BG\_TGT}$ can vary for each die since the respective core offset voltage for each die on wafer may also vary. Additionally, those skilled in the art will further appreciate that the test system 50 can implement the trim methodology, such as described herein, with only minor additional cost relative to many known trimming methodologies.

Figure 3:
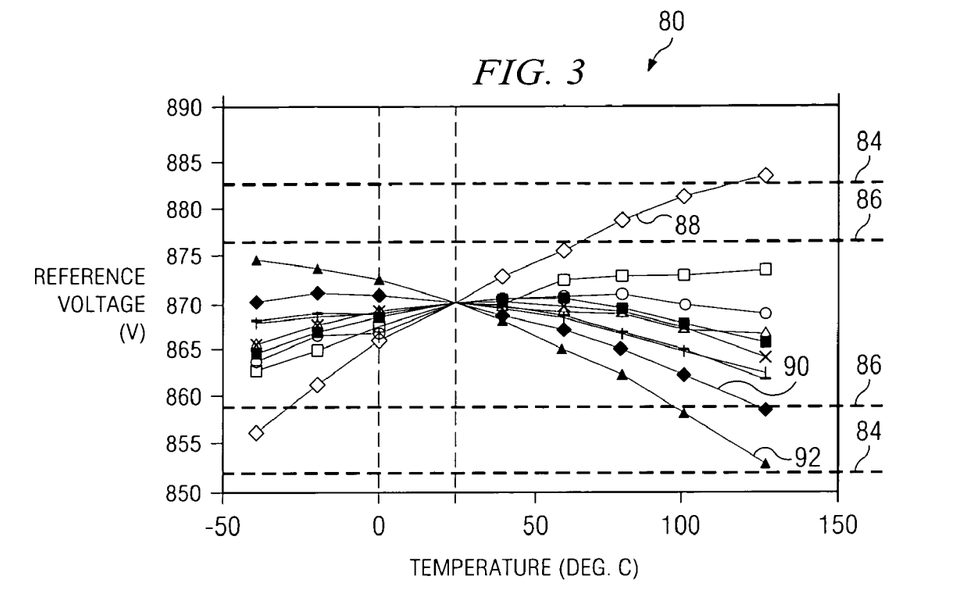
FIG. 3 is a graph depicting buffered reference voltages for a plurality of die having been trimmed according to an existing trim methodology.
Figure 4:
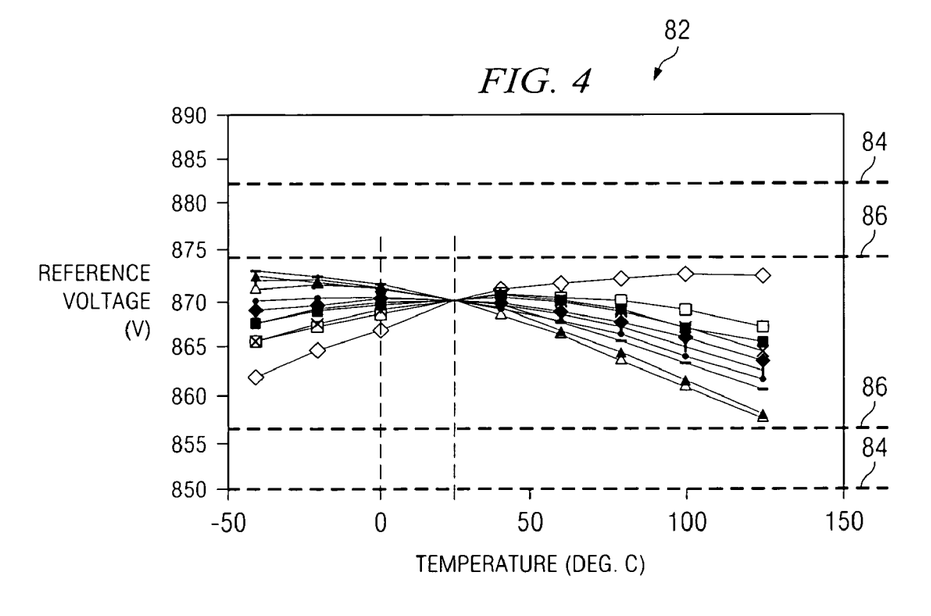
FIG. 4 is graph depicting buffered reference voltages for the same plurality of die as in FIG. 3 having been trimmed according to an aspect of the present invention.

FIGS. 3 and 4 depict a comparison of buffered bandgap voltages for a plurality of IC die. The data represented in each of FIGS. 3 and 4 are for the same die, but trimmed using different trim methods. Specifically, FIG. 3 illustrates a graph 80 of bandgap voltages from die trimmed by an existing trim methodology, and FIG. 4 illustrates a graph 82 of bandgap voltages from the same die trimmed in accordance with an aspect of the present invention. In each of FIGS. 3 and 4, a first level of performance can be ascertained with reference to a pair of lines 84, such as corresponds to +/−2% variation relative to a specified target bandgap reference voltage at room temperature (e.g., at about 25 Deg. C.). A second level of performance is denoted by reference line pair 86, which corresponds to +/−1% variation relative to a specified target bandgap reference voltage at room temperature.

In FIG. 3, it is demonstrated that the bandgap voltages for three die, indicated at curves 88, 90 and 92 (having been trimmed by an existing method), fail to meet the 1% variation. The curves 88 and 92 also fail the more relaxed 2% performance criteria. In contrast, all die in the example of FIG. 4 (having been trimmed according to the present invention) meet the more stringent 1% variation. Thus, the comparison of FIGS. 3 and 4 demonstrates the efficacy of implementing a trim methodology in accordance with an aspect of the present invention. The benefits of more accurate bandgap reference voltage for the IC die will translate to the accuracy of all components on the die (e.g., including power supply circuitry, analog-to-digital converters, current references, etc.).

Figure 5:
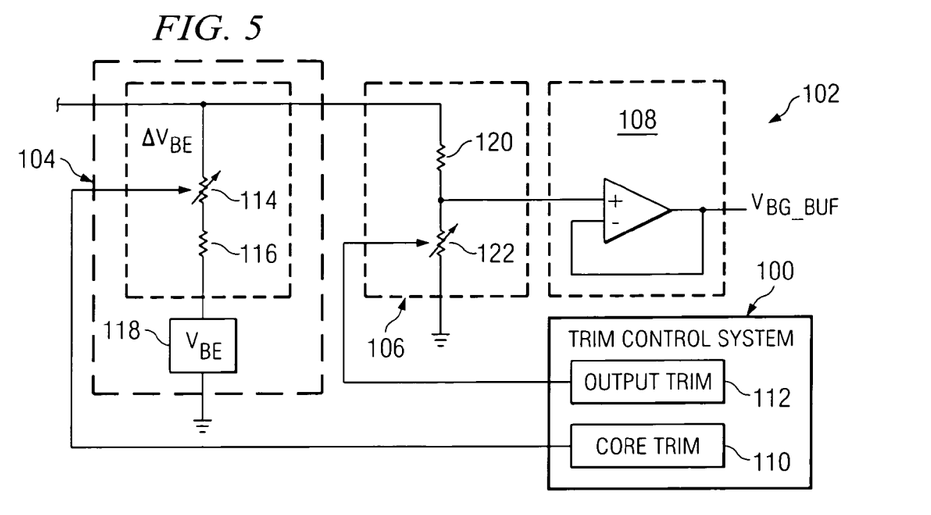
FIG. 5 depicts a schematic example of a bandgap reference voltage circuit and trimming system that can be implemented according to an aspect of the present invention.

FIG. 5 depicts an example of a trim control system 100 that is coupled to set trim codes for associated bandgap circuitry 102. In the example of FIG. 5, the bandgap circuitry includes a core bandgap voltage reference circuit 104 and an output circuit 106. The bandgap output circuit 106 provides a bandgap reference voltage to buffer 108, which is coupled to an output node of the output circuit. The buffer 108 provides a corresponding buffered bandgap reference voltage, indicated at $V_{BG\_BUF}$. For example, the buffer 108 can be implemented at a unity gain amplifier that is driven by an output of the output circuit 106.

The trim control system 100 further includes a core trim control component 110 and an output trim control component 112. The core trim control component 110 is operative to set a corresponding resistor ratio in the core bandgap circuit 104. In the example of FIG. 3, the core bandgap circuit 104 includes a variable resistance 114 coupled in series with a resistance 116, which represents a $\Delta V_{BE}$ associated with a $V_{BE}$ block 118. The $\Delta V_{BE}$ can be a predetermined parameter for the bandgap reference voltage circuitry 102, which is fixed for a given temperature. The $V_{BE}$ block 118 further corresponds to the base-emitter voltage of a transistor that is utilized for generating the bandgap reference voltage. Thus, in the bandgap circuit 104, the base-emitter voltage is summed with the voltage drop across the $\Delta V_{BE}$ resistance 116 to provide the core bandgap voltage. Thus, the core trim control component 110 sets the variable resistor 114 to set a corresponding resistor trim ratio (e.g., $R_{CORE}$) intended to compensate for the core offset represented by the resistor 116, such as described herein.

The output trim control component 112 is utilized to set another resistor ratio, namely, a resistor ratio of the output circuit 106 of the bandgap reference voltage circuitry 102. In the example of FIG. 5, the output circuit 106 is depicted as including a resistor 120 connected in series with a variable resistance 122 between the output of the core bandgap circuit 104 and electrical ground. The node between the resistances 120 and 122 is an output of the bandgap reference voltage circuitry 102 that provides a corresponding trimmed bandgap reference voltage to the buffer 108, such as to the non-inverting input of the unity gain amplifier. The output trim control 112 is utilized to set the resistance ratio between the respective resistors 120 and 122 so as to achieve a desired target bandgap reference, as described herein. For example, the output trim control component 112 can set the output trim code to a nominal output trim code during a first phase of a trim procedure when trimming of the core bandgap circuit 104. The output trim control component 112 can scan the output trim codes during a second phase of the trim procedure to trim the resistance ratio in the output circuit 106. The second phase compensates for the shift in target trim voltage in the first phase allowing recalibration to the desired reference voltage to the output buffer 108. This represents one possible configuration for the output trim.

Figure 6:
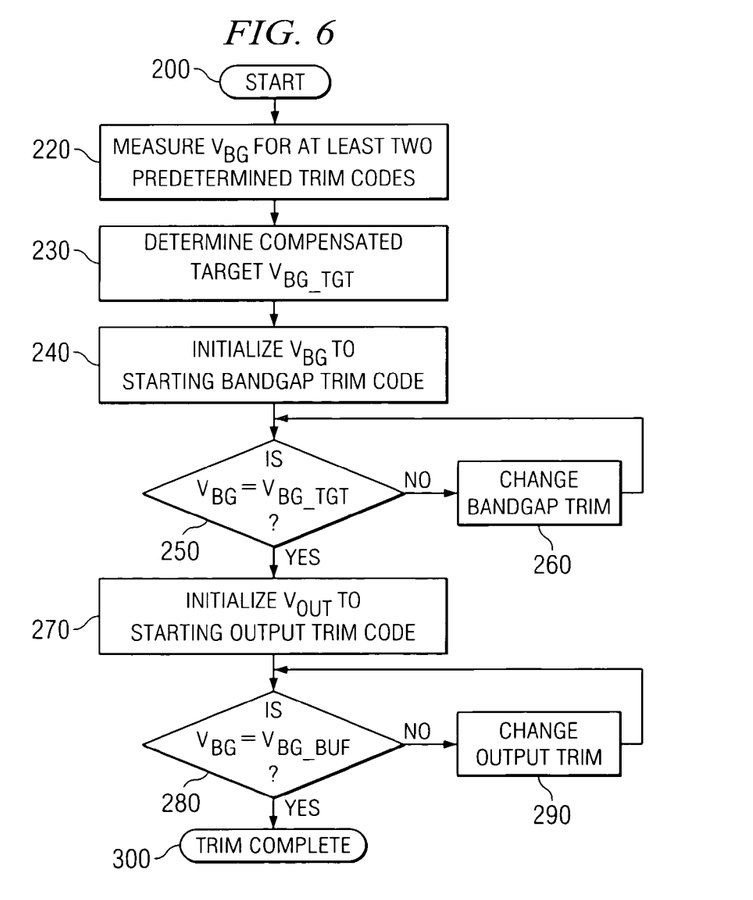
FIG. 6 depicts a flow diagram of a method for trimming bandgap reference voltage circuitry according to an aspect of the present invention.

In view of the foregoing structural and functional features described above, certain methods will be better appreciated with reference to FIG. 6. It is to be understood and appreciated that the illustrated actions, in other embodiments, may occur in different orders and/or concurrently with other actions from that shown in FIG. 6. Moreover, not all illustrated features may be required to implement a method according to an aspect of the present invention. It is to be further understood that the methodology of FIG. 6 can be implemented in hardware (e.g., a computer, a computer network, or test equipment), software (e.g., as executable instructions running on one or more computer systems and/or test equipment), or any combination of hardware and software.

The method begins at 200 in which starting parameters and desired parameters are set. The starting parameters can include, for example, a predetermined $V_{OPT}$ value. Trim codes and their corresponding resistor ratios can also be defined (e.g., each trim code corresponds to a predetermined resistor ratio). As an example, the predetermined $V_{OPT}$ value can be ascertained from initial measurements on a plurality of die (e.g., several a couple hundred dies), initial die produced in a wafer fab. This value of $V_{OPT}$ can then be utilized for trimming subsequent dies produced in the same fab, such that the procedure does not need be repeated on the remaining die. Based upon this optimum target voltage $V_{OPT}$, a nominal ratio of trim resistors can be determined and stored as a fixed parameter associated with the initial target optimum voltage.

At 220, the bandgap reference voltage is measured for at least two predetermined trim codes. As an example, the predetermined trim codes can correspond to a minimum and maximum trim code to provide a sufficient variation in the bandgap reference voltages that are generated by the bandgap reference voltage circuitry. Those skilled in the art will understand and appreciate that the measurements at 220 are not limited to the minimum and maximum trim codes as other trim code settings can be utilized to measure respective reference voltages.

At 230, a compensated target bandgap voltage ($V_{BG\_TGT}$) is determined. The compensated bandgap reference voltage can be determined, for example, as set forth above in Eq. 4. The compensated target bandgap voltage can be determined as a function of core offset voltage in the bandgap circuitry. The core offset can be determined as a function of the measurements and the other known parameters associated with the bandgap circuitry (see, e.g., Eq. 1).

After the compensated target bandgap voltage has been determined (at 230), the method proceeds to 240. At 240, the bandgap voltage is initialized according to a starting bandgap trim code. At 250, a determination is made as to whether the measured bandgap reference voltage ($V_{BG}$) is equal to the target compensated bandgap reference $V_{BG\_TGT}$, which was determined at 230. If the measured bandgap does not equal (or substantially approximate) the determined compensated target bandgap reference (NO), the method proceeds to 260. At 260, the bandgap trim code is changed to the next value (may use many search algorithms including binary search). From 260, the method returns to 250 in which another determination is made. If the measured bandgap reference voltage is equal to (or substantially approximates) the determined compensated target bandgap reference (YES), the method proceeds from 250 to 270. This corresponds to setting the trim code of the core bandgap circuit to the trim code that resulted in the measured bandgap reference substantially equaling the target bandgap reference voltage, as determined at 230.

At 270, another scan can be performed, namely, to set the output trim code for the output circuit of the bandgap circuitry. At 270, the output reference voltage is initialized according to a starting output trim code. At 280, a determination is made as to whether the measured output bandgap reference ($V_{BG}$) is substantially equal to (or approximates) a new target reference voltage ($V_{BG\_BUF}$), such as determined by Eq. 5. This essentially corresponds to trimming back to the original specified reference voltage after trimming the core bandgap circuit. If the output reference $V_{BG}$ does not substantially equal the target reference voltage $V_{BG\_BUF}$ (NO), the method proceeds from 280 to 290. At 290, the output trim code setting is changed and the method returns to 280. The method can loop between 280 and 290 as part of a scan process until the determination at 280 indicates that the measured output voltage $V_{BG}$ is substantially equal to the target bandgap reference voltage $V_{BG\_BUF}$ (YES), and the method proceeds to 300. At 300, the trim method is complete for the die and the output trim code is set to the trim code setting that provided for the condition in which the output reference is equal to the target reference voltage. The method of FIG. 4 can be repeated for each die on a wafer for setting the respective trim codes of the associated bandgap circuitry in each die.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, while some of the foregoing has been described with respect to bandgap voltage of a bipolar junction transistor, the approach described herein is equally applicable to other types of transistors (e.g., field effect transistors). Accordingly, the present invention is intended to embrace all such alterations, modifications, and variations that fall within the spirit and scope of the appended claims.

What is claimed is:

1. A method for trimming reference voltage circuitry, the method comprising:
   defining a desired target reference voltage for a set of at least one die;
   measuring at least two reference voltages for at least two different trim settings associated with a given die of the at least one die;
   determining a modified target reference voltage for the given die based on the at least two measured reference voltages;
   setting a trim setting associated with the reference voltage circuitry of the given die according to the modified target reference voltage so as to compensate for an offset voltage and substantially achieve the desired target reference voltage.

2. The method of claim 1, wherein the at least one die further comprises a plurality of die distributed across a substrate, each of the plurality of die having a bandgap reference voltage circuit, the method further comprising:
   repeating the measuring, the determining, the performing for each of the plurality of die, wherein the modified target reference voltage can vary for each of the plurality of die at a given temperature.

3. The method of claim 1, wherein the at least two different trim settings comprise at least a first trim setting associated with a substantially minimum reference voltage and a second trim setting associated with a substantially maximum reference voltage.

4. The method of claim 1, wherein the trim settings are core bandgap trim settings associated with the given die, each of the core bandgap trim settings having a value corresponding to a resistor ratio for trimming a core bandgap circuit of the reference voltage circuitry.

5. The method of claim 4, wherein after setting the core bandgap trim setting for the given die, the method further comprises:
   performing a scan of output trim settings for the given die, each of the output trim settings having a value corresponding to a resistor ratio for trimming an output circuit of the reference voltage circuitry of given die, the core bandgap circuit being connected with the output circuit; and
   setting the output trim setting for the given die as a function of the modified target trim voltage determined for the given die to provide substantially the desired target reference voltage.

6. The method of claim 1, further comprising determining a core offset voltage for the reference voltage circuitry as a function of the at least two measured reference voltages, the modified target reference voltage for the given die being determined as a function of the core offset voltage.

7. The method of claim 6, wherein the modified target reference voltage ($V_{BG\_TGT}$) is characterized by:

$$V_{BG\_TGT} = V_{BG\_ORIGINAL} - \frac{R_{CORE\_MID} \times V_{O\_CORE}}{R_{OUT\_NOM}}$$

where:
   $V_{BG\_ORIGINAL}$ corresponds to an original desired reference voltage for the IC die;
   $V_{O\_CORE}$ is the core offset voltage for the reference voltage circuitry;
   $R_{CORE\_MID}$ is a resistor ratio to provide a core bandgap trim setting that is between the core bandgap trim settings associated with the least two different trim settings associated with the given die;
   $R_{OUT\_NOM}$ corresponds to a nominal resistor ratio for trimming an output circuit of the reference voltage circuitry.

8. The method of claim 6, wherein the core offset voltage ($V_{O\_CORE}$) is characterized by:

$$V_{O\_CORE} = \frac{V_{BG1} - V_{BG0}}{R_{OUT\_NOM} \times (R_{CORE1} - R_{CORE0})} - \Delta V_{BE}$$

where:
- $R_{CORE1}$ is a resistor ratio associated with a first of the at least two different trim settings;
- $R_{CORE0}$ is a resistor ratio associated with a second of the at least two different trim settings;
- $V_{BG1}$ is a first of the at least two measured reference voltages measured at the first of the at least two different trim settings;
- $V_{BG0}$ is a second of the at least two measured reference voltages measured at the second of the at least two different trim settings; and
- $R_{OUT\_NOM}$ corresponds to a predetermined nominal output trim ratio for an output circuit of the reference voltage circuitry.

9. A system for trimming bandgap reference voltage circuitry to provide a desired reference voltage for a given die, the system comprising:
- means for measuring at least two reference voltages for at least two different trim settings of the given die;
- means for determining a modified target voltage for the given die based on the at least two measured reference voltages;
- means for programming at least one trim setting of the reference voltage circuitry associated with the given die according to the modified target reference voltage.

10. The system of claim 9, wherein the reference voltage circuitry includes a core bandgap circuit and an output circuit, the system further comprising means for computing an offset voltage associated with the core bandgap circuit, the means for determining the modified target reference voltage determining the modified target reference voltage as a function of the offset voltage.

11. The system of claim 10, wherein the means for programming further comprises means for trimming a ratio of resistors of the core bandgap circuit according to the modified target reference voltage.

12. The system of claim 10, wherein the means for programming further comprises means for trimming a ratio of resistors of the output circuit according to the modified target reference voltage corresponding to the desired reference voltage.

13. A system for establishing a desired reference voltage for a given integrated circuit die, the system comprising:
- a measurement system configured to measure at least two reference voltages provided by bandgap reference voltage circuitry of a given die for respective trim settings;
- a calculator operative to compute a modified target reference voltage for the given die based on the at least two measured reference voltages; and
- trim control operative to perform a scan of trim settings associated with the given die and to adjust the reference voltage for the given die according to the modified target reference voltage.

14. The system of claim 13, wherein the calculator is a reference voltage target calculator, the system further comprising an offset calculator that computes a core offset voltage for a core bandgap circuit of the reference voltage circuitry as a function of the at least two measured reference voltages, the reference voltage target calculator computing the modified target reference voltage for the given die as a function of the core offset voltage.

15. The system of claim 14, wherein the core offset voltage ($V_{O\_CORE}$) is characterized by:

$$V_{O\_CORE} = \frac{V_{BG1} - V_{BG0}}{R_{OUT\_NOM} \times (R_{CORE1} - R_{CORE0})} - \Delta V_{BE}$$

where:
- $R_{CORE1}$ is a first resistor ratio associated with a first of the at least two trim settings;
- $R_{CORE0}$ is a second resistor ratio associated with a second of the at least two trim settings;
- $V_{BG1}$ is a first of the at least two measured reference voltages at the first of the at least two trim settings;
- $V_{BG0}$ is a second of the at least two measured reference voltages at the second of the at least two trim settings; and
- $R_{OUT\_NOM}$ corresponds to a predetermined nominal output trim ratio for an output circuit of the reference voltage circuitry.

16. The system of claim 14, further comprising bandgap trim control configured to set a ratio of resistors in the core bandgap circuit according to the modified target reference voltage.

17. The system of claim 16, further comprising an output trim control operative to set a ratio of resistors in an output circuit of the reference voltage circuitry to achieve the desired reference voltage.

* * * * *